United States Patent [19]

Fanucchi

[11] Patent Number: 5,363,075
[45] Date of Patent: Nov. 8, 1994

[54] MULTIPLE LAYER MICROWAVE INTEGRATED CIRCUIT MODULE CONNECTOR ASSEMBLY

[75] Inventor: Richard Fanucchi, Fountain Valley, Calif.

[73] Assignee: Hughes Aircraft Company, Los Angeles, Calif.

[21] Appl. No.: 985,054

[22] Filed: Dec. 3, 1992

[51] Int. Cl.⁵ .......................... H01P 5/00; H05K 5/00
[52] U.S. Cl. ................................ 333/246; 257/728; 333/260; 361/730; 439/63; 439/81
[58] Field of Search ................. 333/246, 247, 260; 257/664, 685, 691, 693, 697–699, 723, 724, 728; 439/43, 49, 53, 54, 63, 81, 581, 582; 174/59; 361/380, 393, 394, 420, 679, 729, 730, 810

[56] References Cited

U.S. PATENT DOCUMENTS

| | | | |
|---|---|---|---|
| 4,577,923 | 3/1986 | Ikemizu | 439/876 |
| 4,745,381 | 5/1988 | Kosugi et al. | 333/245 |
| 5,049,978 | 9/1991 | Bates et al. | 333/247 X |
| 5,206,712 | 4/1993 | Kornrumpf et al. | 333/247 X |

FOREIGN PATENT DOCUMENTS

| | | | |
|---|---|---|---|
| 4901 | 1/1981 | Japan | 333/246 |
| 310203 | 12/1988 | Japan | 333/247 |
| 94701 | 4/1990 | Japan | 333/246 |

*Primary Examiner*—Paul Gensler
*Attorney, Agent, or Firm*—William J. Streeter; Wanda K. Denson-Low

[57] ABSTRACT

A connector assembly for interconnecting microwave integrated circuit modules where each module has at least one microwave interconnection pin and one DC power pin. A groundplane (28) supports the mounting surfaces (32) of the modules (10) and has a plurality of holes (38, 40) for receiving the interconnection pins (18) and the DC power pins (22) of the modules. A conducting layer (78) opposite the mounting surface of the groundplane receives microwave signals from the interconnection pins extending down through it and communicates these signals between different modules. Resilient bellows and stripline are used to ensure matched impedances and secure microwave connections. The DC power pins extend through the conducting layer (78) and isolating groundplane (28) and a DC power grid board (88) where an electrical connection is made with each DC power pin. The DC power pins are held in place in the power grid board using spring sockets so that the modules are installed on the connector assembly simply by inserting the pins into the respective holes and removed simply by pulling the modules away from the connector assembly.

39 Claims, 6 Drawing Sheets

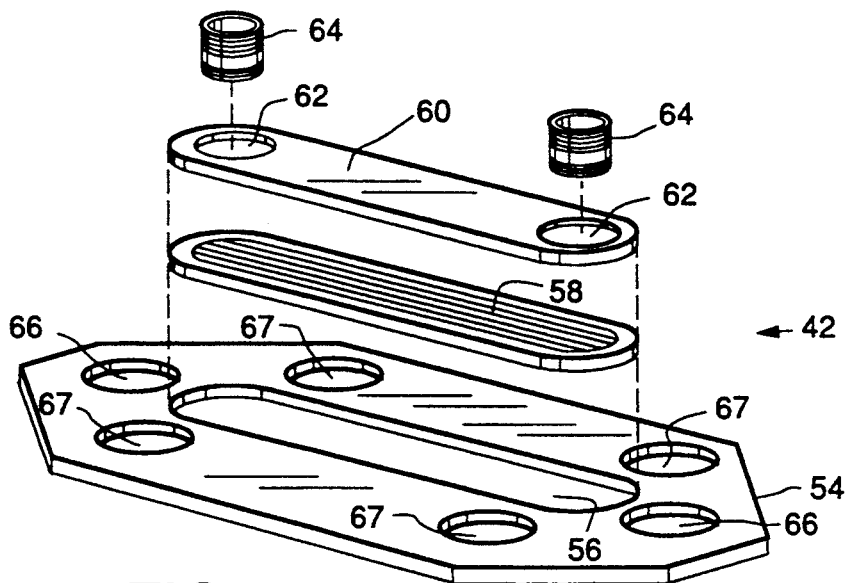
FIG. 3.
FIG. 4.
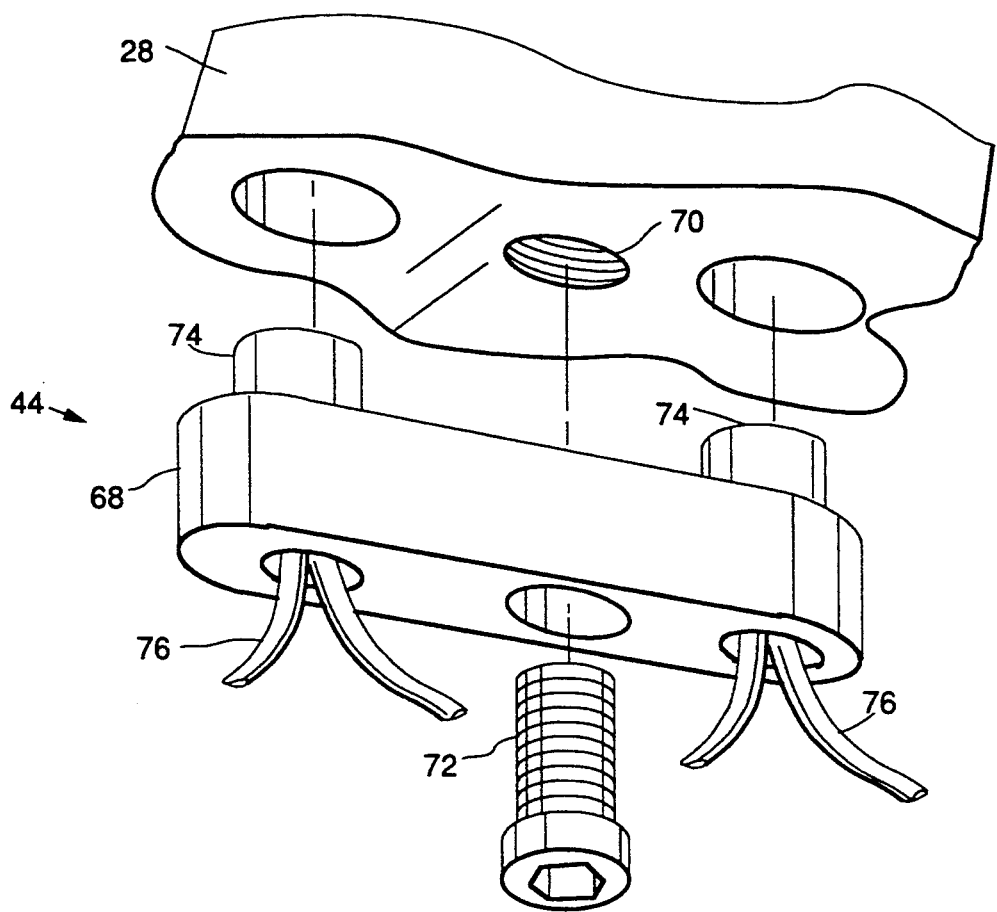

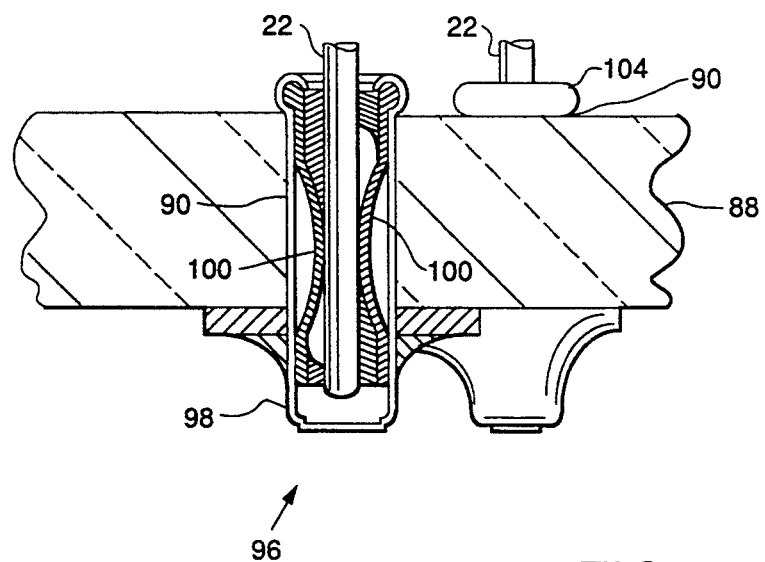
FIG. 7.
FIG. 8.
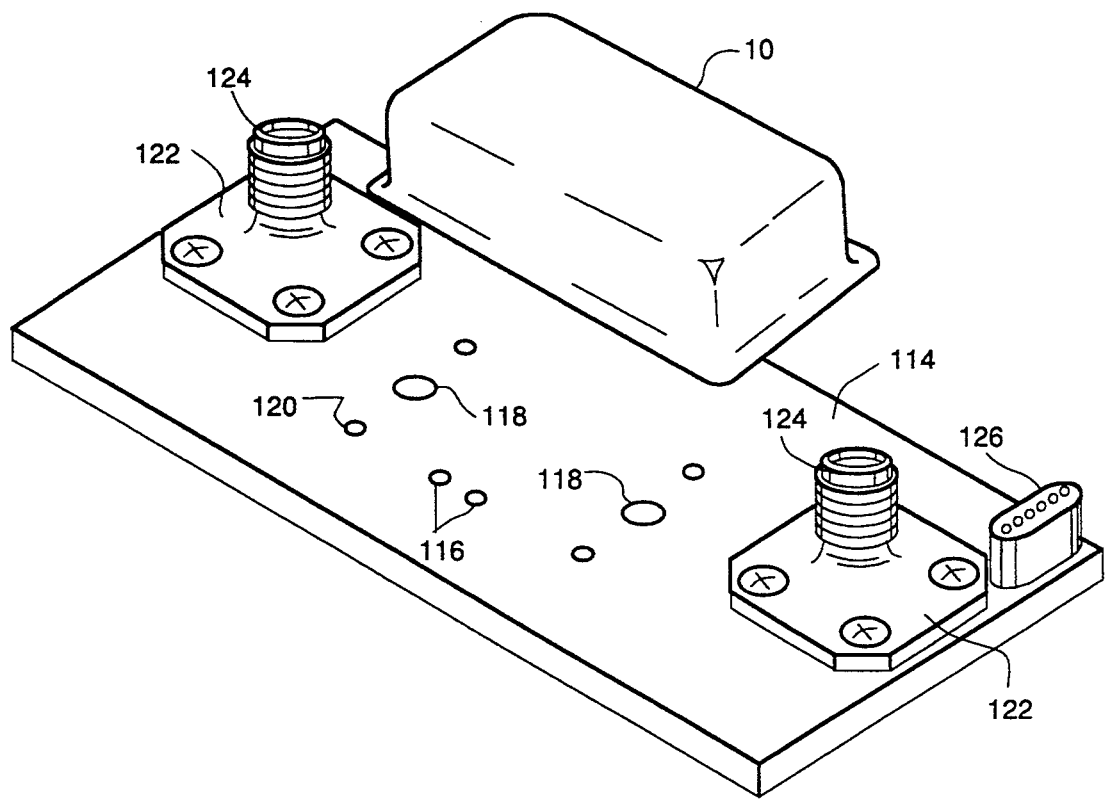

MULTIPLE LAYER MICROWAVE INTEGRATED CIRCUIT MODULE CONNECTOR ASSEMBLY

FIELD OF THE INVENTION

The present invention pertains to the field of microwave communications integrated circuitry and more particularly to a multiple layer assembly for connecting microwave integrated circuit modules.

BACKGROUND OF THE INVENTION

In many applications including communications satellites, Microwave Integrated Circuits (MIC's) and Monolithic Microwave Integrated Circuits (MMIC's) are typically packaged in custom built module assemblies composed of microstrip substrates supported by machined Kovar and aluminum parts. These individual module assemblies are grouped together in a machined aluminum chassis to perform more complex functions. The machined aluminum chassis is a complex array of radio frequency circuit cavities, DC wiring channels and precision mounting bosses, typically custom designed for each application. The resulting assembly is complex, expensive and capable of achieving only those functions which are designed into it.

A less expensive approach is shown, for example, in U.S. Pat. No. 4,745,381, to Kosugi, et. al. in which the microwave integrated circuitry is packaged in discrete modules which have a pair of direct current (DC) power supply pins extending from the modules and a pair of interconnection pins which allow the modules to be coupled together to form more complex devices such as amplifiers and signal processing circuits. The modules are mounted to a wall and connected together either with individual microstrip lines or a leaf spring based microwave connector assembly. This approach requires a large number of independent connectors and the interconnection is neither sufficiently precise nor sufficiently secure for many applications. In addition, the approach presents problems in impedance matching for wideband applications and does not provide a secure and effective interconnection for the DC power supply.

SUMMARY OF THE INVENTION

The present invention provides an inexpensive, precise and secure connector assembly for interconnecting microwave integrated circuit modules wherein each module has at least two microwave interconnection pins extending from a mounting surface of the module. In one embodiment, the invention comprises a groundplane for supporting the mounting surfaces of the modules which has a plurality of holes for receiving the interconnection pins of the modules. A conducting layer opposite the mounting surface of the groundplane receives microwave signals from the interconnection pins that extend through the groundplane and communicates signals between interconnection pins of different modules. The conducting layer has a predetermined impedance. Resilient contacts such as metal bellows are adapted to receive interconnection pins at one end and contact the conducting layer at their opposite ends so that when an interconnection pin is urged against a respective bellows, the bellows is urged against the conducting layer establishing an electromagnetic connection between the interconnection pin and the conducting layer. Each module preferably has at least two power pins extending from the mounting surface of the modules to supply power to the modules and the groundplane has a plurality of holes for receiving the power pins of the modules. A second conducting layer opposite the mounting surface of the groundplane distributes power to the power pins that extend through the groundplane. The conducting layer has a hole for receiving each power pin and each hole has a spring socket for making an electrical connection with the power pin. Preferably, the modules can be inserted into and withdrawn from the connector assembly by inserting the interconnection and power pins into the respective holes in the groundplane and urging them against the respective conducting layers.

BRIEF DESCRIPTION OF THE DRAWINGS

FIG. 3 is an exploded perspective view of an interconnection pin connecting device of FIG. 2.

FIG. 4 is an exploded perspective view of a DC power pin interconnection device of FIG. 2.

FIG. 7 is a cross-sectional side view of a DC power pin spring socket and a portion of the connector assembly of FIG. 5.

FIG. 8 is a perspective view of a test fixture constructed according to the present invention for testing and tuning MIC modules.

DETAILED DESCRIPTION OF THE INVENTION

Figure 1:
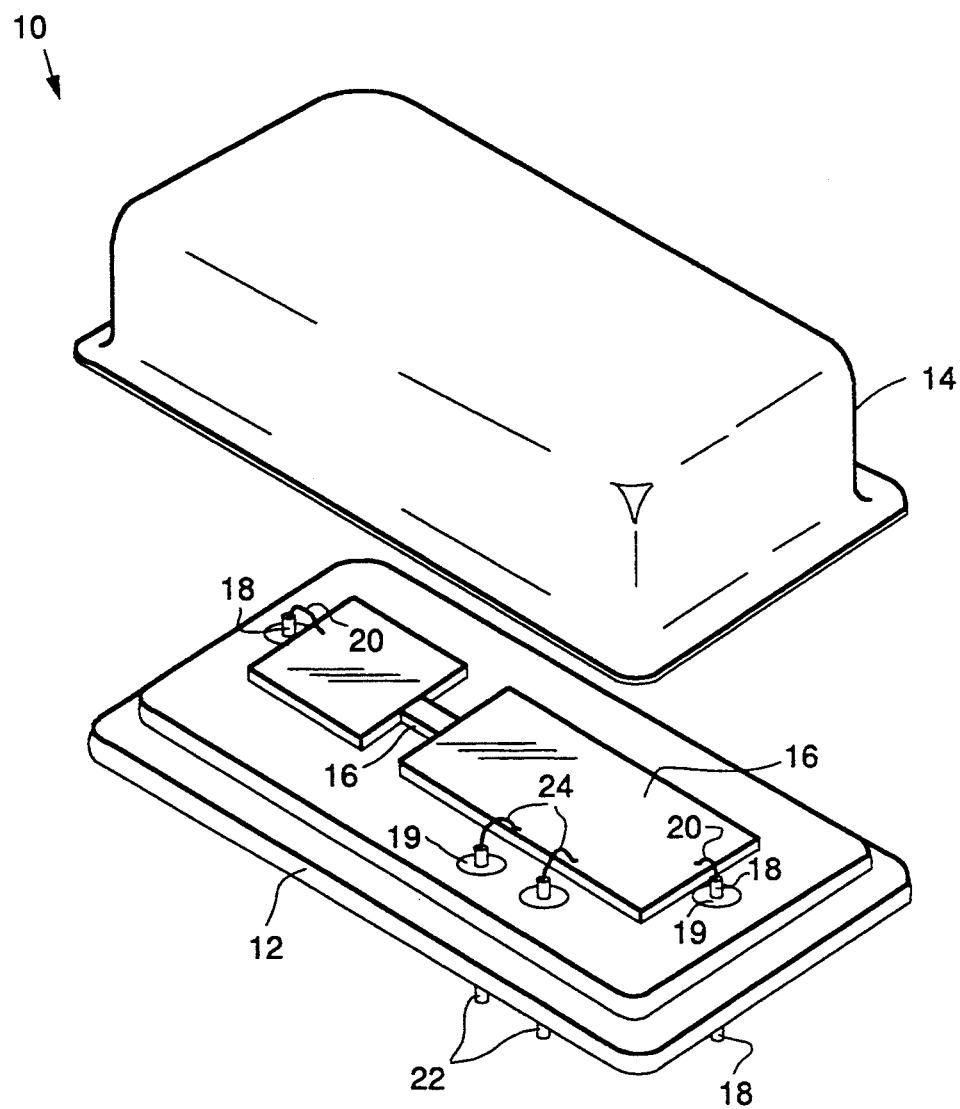
FIG. 1 is a perspective view of a microwave integrated circuit module for use with the present invention with its cover removed.

FIG. 1 shows a microwave integrated circuit (MIC) module 10 with a preferably substantially flat header 12 preferably constructed of formed Kovar, an iron nickel cobalt alloy available from the Carpenter Steel Division of Carpenter Technology Company, or some similar alloy, and a domed cover 14 preferably constructed of drawn Kovar which is then hermetically seam welded to the header. Before the cover is welded to the header, a microwave integrated circuit 16 is affixed to the header as is known in the art. Interconnection pins 18 with insulating sleeves 19 are fastened to the MIC preferably with gold ribbons or wires 20 to conduct microwave signals to and from the circuit 16. The interconnection pins extend from the connection with the MICs out through the header and out of the hermetically sealed interior of the module. Similarly, a pair of DC power pins 22 connected with gold ribbons or wires 24 to the MIC extend within insulating sleeves 19 out through the header. The insulating sleeves are preferably formed of glass. The interconnection and power pins allow the module to be connected to other modules. Each MIC is a self contained discrete component or a circuit such as an amplifier, multiplier or filter which is individually tuned for assembly and then mounted to a connector assembly as will be described below.

Figure 2:
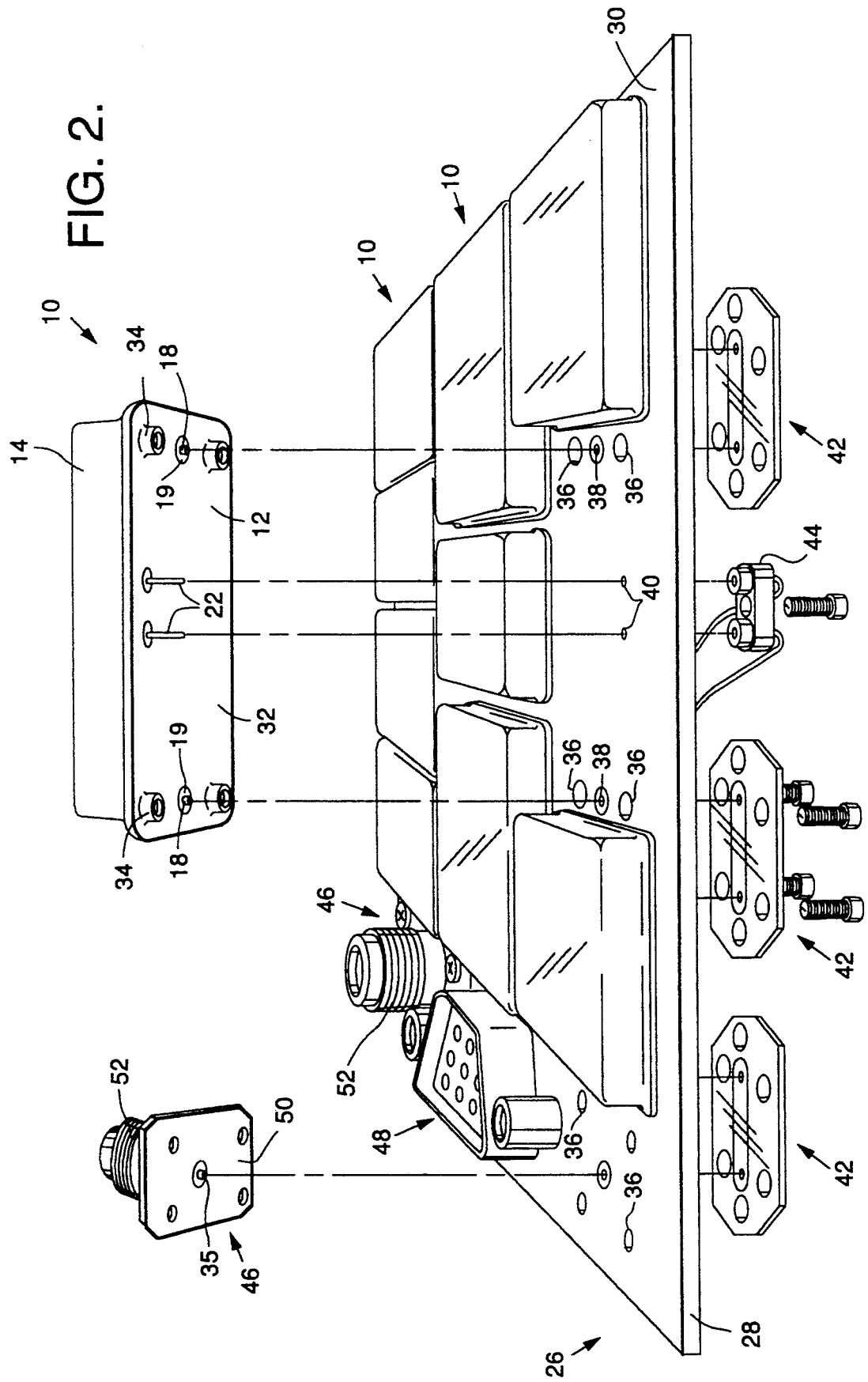
FIG. 2 is a partially exploded perspective view of a connector assembly, according to one embodiment of the present invention, supporting microwave integrated circuit modules and connectors to external circuitry.

As shown in FIG. 2, a number of modules 10 can be connected together using a connector assembly 26 according to the present invention. The connector assembly has a groundplane 28 which is preferably constructed from a substantially flat aluminum plate. The groundplane has a top mounting surface 30 upon which the bottom or mounting surface 32 of the header of each MIC module is mounted. The bottom or mounting surface of each module preferably has a set of four locating posts 34 which mate with locating holes 36 on the mounting surface of the groundplane, to precisely position each module upon the groundplane. The groundplane also has a set of holes 38 for each module which receive the interconnection pins and through which the interconnection pins extend and a second set of holes 40 for each module which receive the DC power pins 22 and through which the DC power pins extend. To install the module on the connector assembly, the locating posts on the mounting surface of the modules are simply inserted into the locating holes on the groundplane thereby aligning the interconnection and power pins into the appropriate holes. The module is then pushed down until the mounting surface of the module contacts and butts against the mounting surface of the groundplane. The interconnection pins of each module are connected to interconnection pins of other modules using connector devices 42 shown in more detail in FIG. 3. The connector devices are fastened to the groundplane opposite the groundplane mounting surface and engage the interconnection pins from different modules to connect modules together. Similarly, the DC power pins which extend through the groundplane are connected together using DC jacks 44 shown in more detail in FIG. 4.

It is preferred that each of the modules have locating posts, interconnection pins and power pins in standardized locations so that any module can be easily inserted into any location on the groundplane mounting surface. This allows the MIC modules to be coupled together in a variety of different ways using the connector devices 42. It also allows for the same connector device to be used to connect together two adjacent modules at any location on the connector assembly. The connector devices can be constructed in different shapes (not shown) to allow modules which are not adjacent to be connected together. In addition to other modules, modules can also be connected with coaxial connectors 46 and multiple pin electrical connectors 48. The coaxial connector preferably has a center interconnection pin 35 that is configured similar to the interconnection pin 18 of the modules, and which interface with the connector assembly in the same manner. The coaxial connectors are fastened to the groundplane by a set of screws. The coaxial connector 46 allows RF signals to be ported into and out of the interconnected modules mounted on the connector assembly. The multiple pin connector 48 is coupled by means of insulated wires to each of the DC jacks 44 so that control signals and power can be used to control and power the modules either collectively or independently. In a simpler embodiment, the multiple pin connector can be replaced with a simple two pin jack for the two terminals of a simple DC connection. For more complex applications, each module may be provided with a third or fourth DC pin so that control signals can be coupled to the individual modules as appropriate using the multiple pin connector.

As shown in FIG. 3, each connector device 42 has a flat base 54 with an internal elongated groove 56 in its top surface. The shape of the base and the groove can be varied to suit different applications. The groove can be formed by machining or can be molded into the part. The base is preferably constructed of an aluminum of the same composition as the groundplane. A transmission path is built into the connector device by inserting a material into the groove in the base. Preferably this transmission path is formed using fifty ohm impedance stripline. Fifty ohm stripline is preferred in order to match the impedance of the module interconnection pins. A dielectric cover plate 60 is attached over the stripline transmission path in the groove in the base in order to isolate the stripline from the groundplane. The cover plate has a hole 62 at each end for receiving the ends of a bellows 64. The bellows are preferably gold plated nickel cylinders with circular convolutions at either or both ends as is well known in the art. The convolutions allow the bellows to function as springs. When the connector devices are assembled, the bellows extend from the holes 62 in the cover plate 60 up into the holes 38 in the groundplane 28 of the connector assembly. When a module is pressed against the groundplane, each interconnection pin is pressed against a top end of a bellows 64. This presses the bottom end of the bellows onto the stripline transmission path 58 to establish the connection between modules. When the module and the connector device are then fastened onto the groundplane, the resiliency of the bellows ensures a consistent secure contact with the connector device. The base of the connector device also has a set of holes. A first set of holes 66 allow the connector device to be prefastened to the groundplane. While a second set of holes 67 are used to mount modules on the opposite side of the groundplane, conventional fasteners, for example, screws or bolts are used. The second set of holes 67 are preferably aligned with the locating posts 34 of the appropriate module or connector so that a screw can be driven through the connector device directly into the corresponding module locating post.

Referring to FIG. 4, a DC jack 44 is used to couple the DC power pins to a source of DC power. The DC jacks fit between connector devices so that they contact the groundplane 28 directly. In a preferred embodiment, the DC jacks have a dielectric body 68 which is fastened into a screw hole 70 in the groundplane using a conventional screw 72. The dielectric body has a set of cylindrical extensions 74 one for each DC power pin which extend into the groundplane. The cylindrical extensions have axial bores with sockets which allow the DC power pins to extend through the centers of the extensions. The bores isolate the DC power pins from the groundplane. After the power pins enter the cylindrical extensions of the body and engage with their respective sockets, wire leads 76 electrically coupled to the sockets are used to couple the power pins to the appropriate source of DC power using the multiple pin connector 48.

As can be seen with reference to FIG. 2, the connector assembly is put together by first attaching the connector devices 42 and prewired DC jacks 44 to the groundplane 28. The bellows and their insulating sleeves are placed into the RF holes in the groundplane and finally the MIC modules 10 are attached to the mounting surface 30 of the connector assembly. The interconnection pins and DC pins are inserted through their appropriate holes, the locating posts are centered in the locating holes and the modules are then fastened to the groundplane using screw holes 67 in the connector devices. The coaxial connectors 46 and the multiple pin connectors 48 are also attached to the mounting surface of the groundplane. The completed connector assembly is coupled to the rest of the microwave signal processing system by coupling the SMA connectors to input and output coaxial cables and by coupling the multiple pin connector to an appropriate source of DC power.

Figure 5:
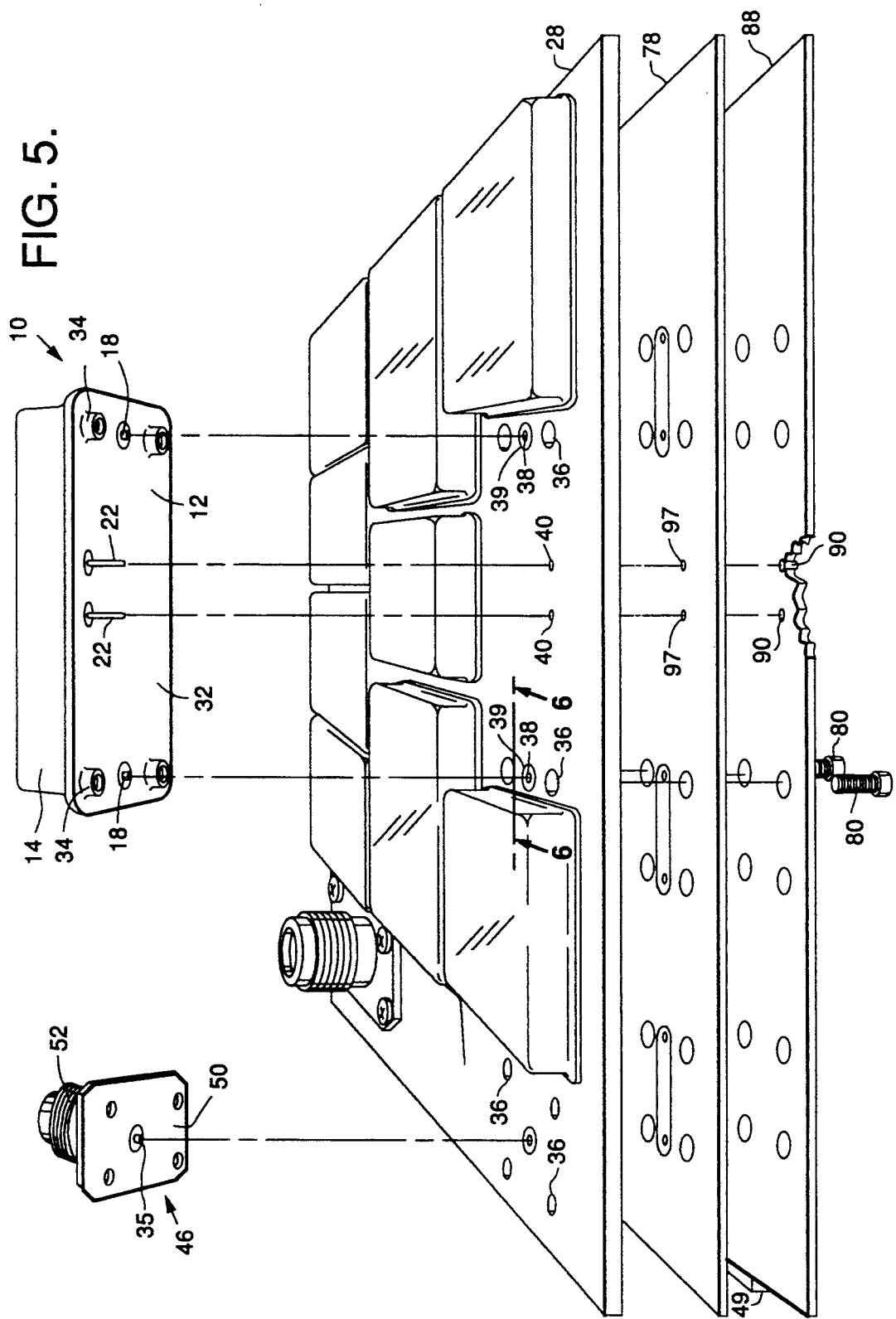
FIG. 5 is a partially exploded perspective alternate embodiment of a connector assembly according to the present invention showing modules and external connectors mounted thereon.

FIG. 5 shows an alternate embodiment of the present invention. Like reference numbers are used to refer to like elements throughout. The groundplane 28 of FIG. 5 is essentially identical to that shown in FIG. 2 and as with the embodiment of FIG. 2 has a set of holes so that MIC modules can be mounted onto the mounting surface 30 of the groundplane by inserting the DC and RF interconnection pins through holes 38 and 40 in the groundplane and locating the appropriate locating posts 34 in the locating holes 36. Coaxial connectors 46 are similarly provided. A multiple pin connector 49 is preferably provided as well. In contrast to the embodiment of FIG. 2, the microwave transmission paths between modules and to and from the coaxial connectors are provided by a single microwave transmission plate 78. This plate is constructed of aluminum which is preferably approximately coextensive with the groundplane 28 and which has a series of grooves 82 (see FIG. 6). Each groove is adapted to carry a piece of stripline 84 to establish a microwave transmission path between modules. Although any sort of microwave transmission medium may be used, it is presently preferred that the impedance of the transmission path be fifty ohms to match the impedance of the modules interconnection pins. The grooves can be machined or cast in a variety of configurations to connect modules to each other in any way desired. It is not necessary that the grooves connect only adjacent modules to each other.

Alternatively, the microwave transmission plate 78 can be constructed entirely from an RF conducting material such as duroid, i.e. the entire plate can be made of stripline. Isolation can be provided in areas of the plate to define the transmission paths using isolation techniques well known in the art. Such a construction should be lighter in weight and less expensive than the embodiment of FIG. 5.

Figure 6:
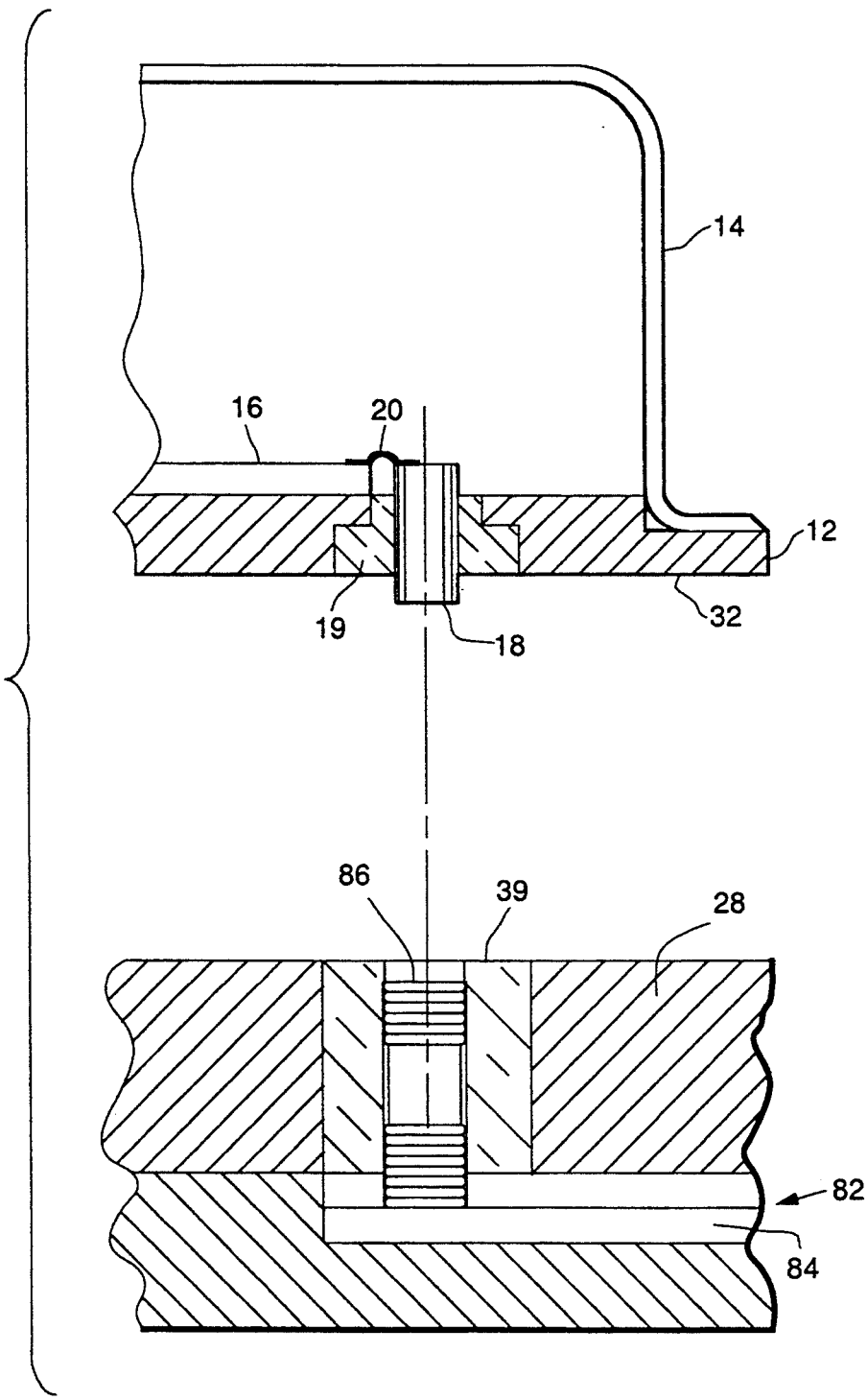
FIG. 6 is a cross-sectional side view of a portion of a module with an interconnection pin and a portion of a connector assembly taken along line 6—6 of FIG. 5.

As shown in FIG. 6, a bellows 86 of the type shown in FIG. 3 is preferably used to connect interconnection pins 18 to the corresponding stripline conductor 84. As described above, as a module is pressed onto the groundplane 28, the interconnection pin is inserted into the hole 38 in the groundplane which is insulated by a nylon sleeve 39. The pin compresses the bellows 86. After the module is fastened to the groundplane, the resiliency of the bellows ensures a contact between the conducting stripline path 84 and the interconnection pin 18. The embodiment of FIG. 5 also includes a DC power grid board 88 below the microwave transmission board and opposite the groundplane 28. The power grid board is preferably constructed using conventional printed circuit board technology and like the microwave transmission plate is substantially coextensive with the groundplane. It has groups of holes 90 to receive the DC power pins of each of the modules. The holes are aligned with holes 97 in the microwave transmission plate 78 above it. The DC power pins extend through each of the holes in each of the plates to the DC power grid and are coupled to a source of DC power using the DC power grid.

Preferably, the power grid board contains at least one layer of deposited copper or other wiring as is well known in the art to connect the power pins to a multiple pin cable connector 49 which can be fastened directly to the power grid board. Screws 80 extend through the board, plate and groundplane to help secure the entire assembly together.

The power pins can be soldered directly to the power grid board using well known techniques, this will serve to help secure the MIC modules in place on the connector assembly. It is preferred, however, that a commercially available spring socket 96 as shown in FIG. 7 be used in each hole in the power grid board. Each spring socket has a conductive spring sleeve 98 which extends through a hole 90 in the power grid board. The spring sleeve has a set of axial leaves 100 which resiliently contact a power pin to establish an electrical connection with it. The spring socket is mounted onto the power grid board by inserting it into an appropriate hole in the power grid board until an upper flange 104 butts against a surface of the power grid board. Electrical connection is established with the power pin 22 and the spring socket which is soldered to the conductive layers of the power grid board 88.

The connector assembly of FIG. 5 is assembled by sandwiching together the microwave transmission plate, the DC power grid board and the groundplane to form a multiple layer connector assembly. The modules are then simply inserted into the corresponding holes and fastened in place. Because the bellows resiliently establish a microwave transmission path with the microwave transmission plate and the spring sockets resiliently establish an electrical contact with the DC power grid, MIC modules can easily be inserted and removed into the connector assembly for experimentation and test purposes before being permanently fastened into place with screws. For environments with low stress, vibration and shock, the modules need not be permanently fastened to the connector assembly. Accordingly, in the event of a failure, a MIC module may be removed from the connector assembly, tested independently and then either reinstalled or replaced with a functional module. In addition, a completed unit can be upgraded by replacing obsolete modules with improved modules or the function of a particular unit can be modified by replacing certain modules with other modules. In contrast to prior systems which relied on gold ribbons or wires for microwave interconnections or on leaf spring shaped tabs, the impedance of the connector assembly is very well defined by the pins and the preferably stripline microwave transmission paths interconnecting them. This eliminates a significant amount of the testing and tuning which is required with conventional MIC module assemblies, greatly reducing the cost of the finished product. The DC power connection is also made significantly simpler and less expensive through the use of spring sockets and printed circuit board technology.

A test fixture can easily be constructed using the principles of the present invention as shown in FIG. 8. The test fixture of FIG. 8 is constructed according to the principles of the multiple layer connector assembly of FIG. 5 although principles shown in FIG. 2 may also be applied. Accordingly, there is a groundplane mounting surface 114 with a set of holes 116 for the DC power pins, a set of holes 118 for the microwave interconnection pins and a set of locating holes 120 to help secure a MIC module 10 into the proper position on the test fixture. Coaxial connectors 122 which are coupled through a microwave transmission board layer to the interconnection pin holes 118 allow a variety of test signals to be transmitted through the MIC module mounted to the test fixture by coupling the signals into the coaxial ports 124 of the connectors. A multi pin DC power plug 126 mounted on the surface of the test fixture couples through a DC power grid board to the power pin holes 116. A MIC module is tested simply by plugging its respective interconnection and DC power pins into the holes of the test fixture until contact is made with the corresponding communication paths within the multiple layer board. DC power is applied through the cable connector 126 and various microwave signals can be routed via the coaxial ports 124. The MIC module can be tuned on this test fixture and then transferred directly to a connector assembly as shown in FIG. 5. No further tuning is necessary because of the matching impedances in the connector assembly. The simple plug in, pull out operation of the connector assembly is particularly helpful during the use of the test fixture.

It will be appreciated by those skilled in the art that a variety of modifications and adaptations can be made to the present invention without departing from the scope thereof. Additional microwave transmission layers or connecting devices can be provided for testing and other interconnection functions. The entire connector assembly with MIC modules may be enclosed in a housing fastened, for example, onto the mounting surface of the groundplane. The particular materials suggested can be varied to suit the demands of different applications, for example, the structures suggested as being constructed of Kovar or aluminum may also be made of other materials if appropriate to the application intended. Features of the invention can be combined together in different ways. For example, the DC power pin connection technique of FIG. 2 can be applied to the microwave transmission plate of FIG. 5 or vice versa. The specific locations of pins and the configuration of the modules can be greatly modified as well as the types of connectors used to couple the connector assembly to its inputs and outputs. It is not intended to limit the invention to the particular embodiments described above but only by the attached claims.

What is claimed is:

1. A multiple layer connector assembly for interconnecting microwave integrated circuit modules wherein each module has at least one microwave interconnection pin extending from a mounting surface of the module comprising:
    a groundplane having a mounting surface for supporting the mounting surfaces of the modules, the groundplane having a plurality of holes for receiving the interconnection pins of the modules;
    a conducting layer on the side of the ground plane opposite the mounting surface of the groundplane for receiving microwave signals from the interconnection pins of each module and for communicating signals between interconnection pins of different modules, the conducting layer having a predetermined impedance; and
    a plurality of resilient bellows each having a first end oriented toward the groundplane mounting surface and a second end oriented toward the conducting layer and wherein each bellows is adapted to receive an interconnection pin at the first end and to contact the conducting layer at the second end so that when an interconnection pin is urged against the respective bellows first end, the bellows second end is urged against the conducting layer, establishing an electromagnetic connection between the respective interconnection pin and the conducting layer.

2. The assembly of claim 1 wherein the groundplane comprises an aluminum plate.

3. The assembly of claim 2 wherein the groundplane comprises a dielectric liner in each of the groundplane holes.

4. The assembly of claim 1 wherein the conducting layer comprises a set of microwave transmission line paths fastened to the groundplane.

5. The assembly of claim 1 wherein the conducting layer comprises a plate having a set of microwave transmission line paths fastened to it.

6. The assembly of claim 1 wherein the bellows are each disposed at least partially within a respective hole in the groundplane.

7. The assembly of claim 1 wherein the bellows comprise nickel.

8. The assembly of claim 1 comprising a dielectric sleeve within the hole between the bellows and the groundplane.

9. The assembly of claim 1 wherein the impedance of the bellows is selected to match the impedance of the conducting layer.

10. The assembly of claim 1 wherein the conducting layer comprises a plurality of discrete segments.

11. The assembly of claim 10 wherein each segment comprises a dielectric substrate supporting a plurality of stripline interconnection paths for communicating signals.

12. The assembly of claim 1 wherein the conducting layer comprises a dielectric substrate supporting a plurality of stripline interconnection paths for communicating signals.

13. The assembly of claim 1 wherein the predetermined impedance is chosen to match the impedance of transmission paths within the modules.

14. The assembly of claim 1 wherein the conducting layer comprises a conductive plate having an isolation portion to define transmission paths between interconnection pins.

15. The assembly of claim 1 wherein each module has at least one DC pin extending from the mounting surface of the modules for supplying direct current to the modules and wherein the groundplane has a plurality of holes for receiving the DC pins of the modules, the assembly further comprising:
    a second conducting layer opposite the mounting surface of the groundplane for distributing current to the DC pins that extend through the groundplane, the second conducting layer having a plurality of holes, each for receiving a DC pin, each hole having a spring socket for receiving the DC pin and making an electrical connection therewith.

16. The assembly of claim 15 wherein the conducting layer for receiving microwave signals is between the groundplane and the second conducting layer, the groundplane and both of the conducting layers having a respective plurality of holes for receiving the DC pins.

17. A multiple layer connector assembly for supplying current to microwave integrated circuit modules wherein each module has at least two DC pins extending from a mounting surface of the module comprising:
- a groundplane having a mounting surface for supporting the mounting surface of the modules, the groundplane having a plurality of holes for receiving the DC pins of the modules;
- a conducting layer on the side of the groundplane opposite the mounting surface of the groundplane for distributing current to the DC pins that extend through the groundplane, the conducting layer having a hole for receiving each DC pin, each hole having a spring socket for receiving the DC pin and making an electrical connection therewith.

18. The assembly of claim 17 wherein the groundplane comprises a dielectric liner in each of the groundplane holes.

19. The assembly of claim 17 wherein the spring socket comprises an elongated conductive spring sleeve for pressing radially in toward the center of the hole against the pin received in the respective hole.

20. The assembly of claim 19 wherein the conductive spring sleeve comprises leaves for pressing radially against the respective pin.

21. The assembly of claim 17 wherein the conducting layer comprises a printed circuit board having a dielectric substrate and a conducting surface thereon for distributing current to the DC pins.

22. The assembly of claim 17 wherein the microwave integrated circuit modules each have at least two microwave interconnection pins extending from a mounting surface of the module, wherein the groundplane has a plurality of holes for receiving the interconnection pins of the modules and further comprising a conducting layer opposite the mounting surface of the groundplane for receiving microwave signals from the interconnection pins that extend through the groundplane and for communicating signals between interconnection pins of different modules, the conducting layer having a predetermined impedance.

23. A connector assembly for interconnecting microwave integrated circuit modules wherein each module has at least two microwave interconnection pins extending from the respective module comprising:
- a substrate;
- a conducting layer on the substrate for receiving microwave signals from the interconnection pins and for communicating signals between interconnection pins of different modules, the conducting layer having a predetermined impedance; and
- a plurality of resilient bellows each having a first end oriented toward an interconnection pin and second end oriented toward the conducting layer and wherein each bellows is adapted to receive an interconnection pin at the first end and to contact the conducting layer at the second end so that when an interconnection pin is urged against the respective bellows first end, the bellows second end is urged against the conducting layer, establishing an electromagnetic connection between the respective interconnection pin and the conducting layer.

24. The assembly of claim 23 wherein the impedance of the bellows is selected to match the impedance of the conducting layer.

25. The assembly of claim 23 wherein the conducting layer and the substrate comprise a plurality of discrete segments.

26. The assembly of claim 25 comprising a groundplane between the modules and the substrate for supporting the modules.

27. The assembly of claim 25 wherein each segment comprises a dielectric substrate supporting a plurality of stripline interconnection paths for communicating signals.

28. The assembly of claim 23 comprising a second layer for supporting the modules.

29. The assembly of claim 28 wherein the second layer comprises a plurality of holes for receiving the interconnection pins of the modules.

30. The assembly of claim 28 wherein the second layer is between the modules and the substrate and further comprising a plurality of resilient bellows each disposed at least partially within a respective hole in the second layer and having a first end oriented toward an interconnection pin and a second end oriented toward the conducting layer and wherein each bellows is adapted to receive a pin at the first end and to contact the conducting layer at the second end so that when an interconnection pin is urged against the respective bellows first end, the bellows second end is urged against the conducting layer, establishing an electromagnetic connection between the respective interconnection pin and the conducting layer.

31. A multiple layer connector assembly for interconnecting and for supplying direct current to microwave integrated circuit modules wherein each module has at least two microwave interconnection pins and at least two DC pins extending from a mounting surface of the module comprising:
- a supporting layer for supporting the mounting surface of the modules, the layer having a plurality of holes for receiving the pins of the modules;
- a first conducting layer for releasably resiliently electrically connecting with the interconnection pins upon application of the interconnection pins against the conducting layer through the respective holes in the groundplane, for receiving microwave signals from the interconnection pins and for communicating signals between interconnection pins of different modules;
- a second conducting layer for releasably resiliently electrically connecting with the DC pins upon application of the DC pins against the second conducting layer through the respective holes in the groundplane, for distributing power to the DC pins and for making an electrical connection therewith, the second layer being disposed so that the DC pins of a respective module electrically connect with the second layer upon electrical connection of the interconnect pins of the same module with the first conducting layer;
- the interconnection pins and the DC pins being releasable from the respective layer upon withdrawal of the respective pins from the respective holes.

32. The assembly of claim 31 comprising a plurality of resilient bellows each having a first end oriented toward an interconnection pin and a second end oriented toward the first conducting layer and wherein each bellows is adapted to resiliently receive an interconnection pin at the first end and to resiliently contact the conducting layer at the second end so that when an interconnection pin is urged against the respective bellows first end, the bellows second end is urged against the first conducting layer, establishing an electromagnetic connection between the respective interconnection pin and the first conducting layer.

33. The assembly of claim 32 wherein the bellows are each disposed at least partially within a respective hole in the supporting layer.

34. The assembly of claim 33 comprising a dielectric sleeve within the hole between the bellows and the supporting layer.

35. The assembly of claim 32 wherein the impedance of the bellows is selected to match the impedance of the first conducting layer.

36. The assembly of claim 32 wherein the second conducting layer comprises a hole for receiving each DC pin, each hole having a socket for receiving the DC pin and making an electrical connection therewith.

37. The assembly of claim 36 wherein the socket comprises a spring socket having an elongated conductive spring sleeve for pressing radially in toward the center of the hole against the pin received in the respective hole.

38. The assembly of claim 31 wherein the first conducting layer comprises a plurality of discrete segments.

39. The assembly of claim 38 wherein each segment comprises a dielectric substrate supporting a plurality of stripline interconnection paths for communicating signals.

* * * * *